United States Patent [19]

Tsukagoshi

[11] Patent Number: 5,034,819
[45] Date of Patent: Jul. 23, 1991

[54] CHANNEL SELECTING APPARATUS AND METHOD USED IN A TELEVISION RECEIVING APPARATUS AND CAPABLE OF MEMORIZING CHANNEL DATA

[75] Inventor: Masahiko Tsukagoshi, Saitama, Japan

[73] Assignee: Kabushiki Kaisha Toshiba, Kawasaki, Japan

[21] Appl. No.: 540,004

[22] Filed: Jun. 19, 1990

[30] Foreign Application Priority Data

Jun. 20, 1989 [JP] Japan ................................ 1-158488

[51] Int. Cl.⁵ ........................................... H04N 5/50
[52] U.S. Cl. ............................. 358/191.1; 358/193.1; 358/194.1; 455/186; 455/182
[58] Field of Search .............. 358/191.1, 192.1, 193.1, 358/194.1, 189; 455/182, 185, 186, 151, 352

[56] References Cited

U.S. PATENT DOCUMENTS

| | | | |
|---|---|---|---|
| 4,737,993 | 4/1988 | DeVilbiss | 358/191.1 |
| 4,750,040 | 6/1988 | Hakamada | 455/185 |
| 4,763,195 | 8/1988 | Tults | 358/191.1 |
| 4,776,038 | 10/1988 | Testin | 358/193.1 |
| 4,860,380 | 8/1989 | Mengel | 455/185 |
| 4,870,492 | 9/1989 | Hakamada | 358/194.1 |

FOREIGN PATENT DOCUMENTS 0294979 12/1986 Japan .
0234678 9/1988 Japan .

Primary Examiner—John K. Peng
Assistant Examiner—Sherrie Hsia
Attorney, Agent, or Firm—Cushman, Darby & Cushman

[57] ABSTRACT

A channel selecting apparatus for television receivers and the like wherein, in case data showing a predetermined channel are stored in a memory (RAM of a channel selecting microcomputer), a first channel selection device provides a tunner with a channel selection controlling signal based on this data. However, in case the data showing the predetermined channel is not stored in the memory, a second channel selection device sequentially provides channel selection controlling signals for receiving respective channels and, when a judging signal showing that a broadcast signal is included in a receiving channel is input from a judging circuit, that channel will be received.

2 Claims, 3 Drawing Sheets

CHANNEL SELECTING APPARATUS AND METHOD USED IN A TELEVISION RECEIVING APPARATUS AND CAPABLE OF MEMORIZING CHANNEL DATA

Background of the Invention

1. Field of the Invention

This invention relates to a television receiver channel selecting apparatus whereby an up/down-channel selection is possible.

2. Description of the Related Art

In the conventional television receiver channel selecting apparatus, there are already such channel selecting operation systems for designating receiving channels as (a) a one-touch channel selecting method wherein an inputting apparatus having a plurality of keys is provided, receiving channels are allotted to the respective keys and the desired key is operated, (b) a direct channel selecting method wherein the number of the desired receiving channel is key-input by utilizing a ten-key keyboard and (c) an up/down-channel selecting method wherein channel numbers are switched sequentially from a small number to a large number (up) or in the reverse direction (down) by using up and down channel selecting buttons.

Further, with multi-channeled CATV or at midnight when some broadcasting stations have ended broadcasting, the users usually will not know on what channel a broadcast is being made. In such case, it is convenient to adopt a sequential search up/down channel selecting method wherein only the channels having a broadcast signal are detected.

FIG. 4 (prior art) is a flow chart for explaining an up/down channel selecting operation by searching for a channel having a broadcast signal in the conventional channel selecting apparatus.

Now, for example, when an up-button is operated, in the steps S1 and S2, a tuner will select the next channel having a channel number one number larger than the presently received channel number. Then, in the step S3, it is judged whether a broadcast is now being made in the selected channel or not, that is, whether or not the channel received is a channel (mentioned as a signal channel hereinafter) including a broadcast signal. If it is not a signal channel, the process will be moved to the step S1 and the next channel will be selected. In case it is a signal channel, this channel will be selected. Thus only the signal having channel will be selected and received. Therefore, the user does not need to know the current signal channel number but can easily receive the signal channel by operating the up-button or down-button.

Also, the conventional channel selecting apparatus has a function (which shall be mentioned as a memory channel up/down-selection hereinafter) of storing data of a predetermined channel in advance and up/down-searching only the channel (which shall be mentioned as a memory channel hereinafter) based on this stored data. This function will be effective for multi-channeled CATV.

Now, in the recent television receiver, though a memory channel up/down-selecting system is adopted, if non-volatile memory is adopted as a memory for memorizing channels, there will be no particular problem. However, in the television receiver having no non-volatile memory, when volatile RAM of a channel selecting microcomputer is adopted as a memory, if the main power source is off for a long time, the data of the memory channel will vanish. Then, even if the user designates a memory channel up/down-selection, the channel selecting operation will not be made. Therefore, there exists a problem that the user must judge whether the data of the memory channel is memorized in the RAM or not and instruct the up/down-channel selection.

OBJECT AND SUMMARY OF THE INVENTION

An object of the present invention is to provide, in the television receiver having no non-volatile memory, a channel selecting apparatus which judges whether or not the data of the memory channel is stored in a RAM and, when the data is not stored, a signal channel will be searched in an up/down-channel selecting operation but, when data is stored, the memory channel will be automatically switched to perform an up/down-channel selecting opeation so that the operatability during channel selection may be improved.

The channel selecting apparatus of the present invention comprises:

a tuner for selecting a signal of a channel based on a channel selection controlling signal from input television signals;

a judging circuit outputting a judging signal for judging whether or not a broadcast signal is included in this signal selected by the tuner;

a memory for memorizing data indicative of a predetermined channel; and signal providing means for providing channel selection controlling signals to the tuner means. The signal providing means are characterized in that if data representing predetermined channels is stored in the memory (RAM of a channel selecting microcomputer), the channel selecting microcomputer will sequentially switch the channels based on the stored data which includes data indicative of the first channel to be selected. If data representing predetermined channels is not stored in the memory, the channel selecting microcomputer will instruct the tuner to sequentially switch channels until the judging signals indicate that broadcast signals are included in the signals received by particular channels. Then, those channels will be selected and thus the broadcast signals of those channels will be received.

DETAILED DESCRIPTION OF THE PREFERRED EMBODIMENT

Figure 1:
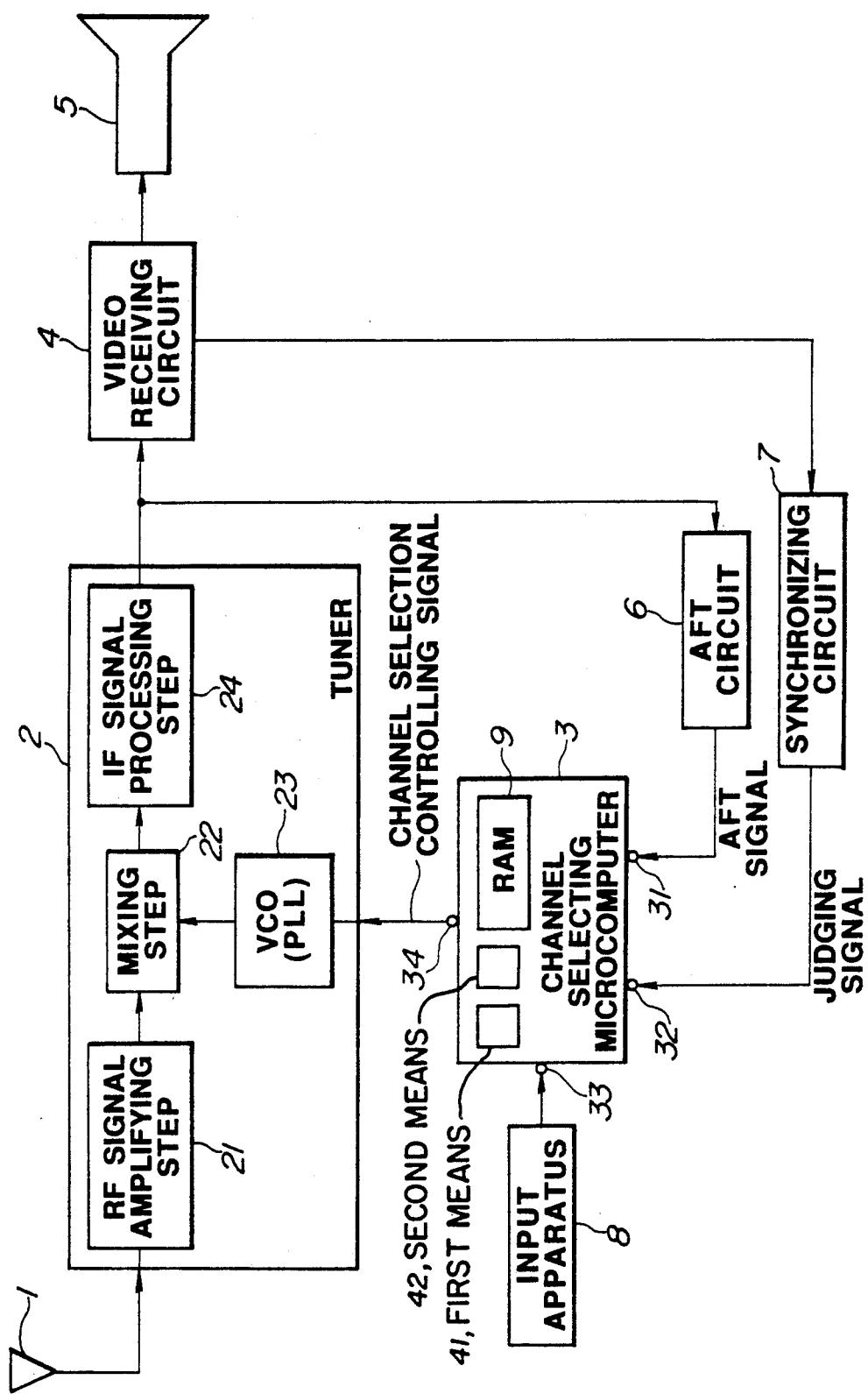
FIG. 1 is a block diagram showing a channel selecting apparatus according to the present invention.

FIG. 1 is a block diagram showing an embodiment of a channel selecting apparatus according to the present invention.

A television high frequency signal (which shall be mentioned as an RF signal hereinafter) is received by an antenna 1. This RF signal is fed to a tuner 2 whose operation includes an RF signal amplifying step 21, mixing step 22, local oscillating step (VCO) 23 and IF signal processing step 24. The VCO 23 is arranged in a PLL loop and the oscillation frequency is controlled. An example of a tuner utilizing a PLL is disclosed in U.S. Pat. No. 4,422,096. This tuner 2 has the frequency of the VCO 23 controlled by the channel selection controlling signal from a signal feeding means such as a channel selecting microcomputer 3. An RF signal of a channel designated by the channel selection controlling signal is selected, mixed with a local oscillation signal from the VCO 23, converted to a signal (IF signal) of a predetermined intermediate frequency and is output to a video receiving circuit 4. The video receiving circuit 4 has an intermediate frequency amplifying circuit, video detecting circuit and color demodulating circuit (all not illustrated). The video receiving circuit 4 converts the received IF signal to a video signal to be displayed and provides the video signal to a cathode-ray tube 5 which displays the video image of the receiving channel on its displayed picture.

An AFT circuit 6 receives the signal from the IF signal processing step 24 of the tuner 2 detects the difference between the frequency of the IF signal and a predetermined intermediate frequency, and outputs an automatic fine tuning signal (AFT signal) to the channel selecting microcomputer 3 at the terminal 31. Judging means such as a synchronizing circuit 7 separates the synchronizing signal component included in the video signal detected in the video receiving circuit 4 and outputs a judging signal to the channel selecting microcomputer 3 at the terminal 32. The judging signal shows whether or not a horizontal synchronizing signal is included, that is, whether or not there is a broadcast signal. An input apparatus 8 is provided with keys (i.e. ten keys) and outputs control data based on the keys operated by the user to the channel selecting microcomputer 3 at the terminal 33.

Figure 2:
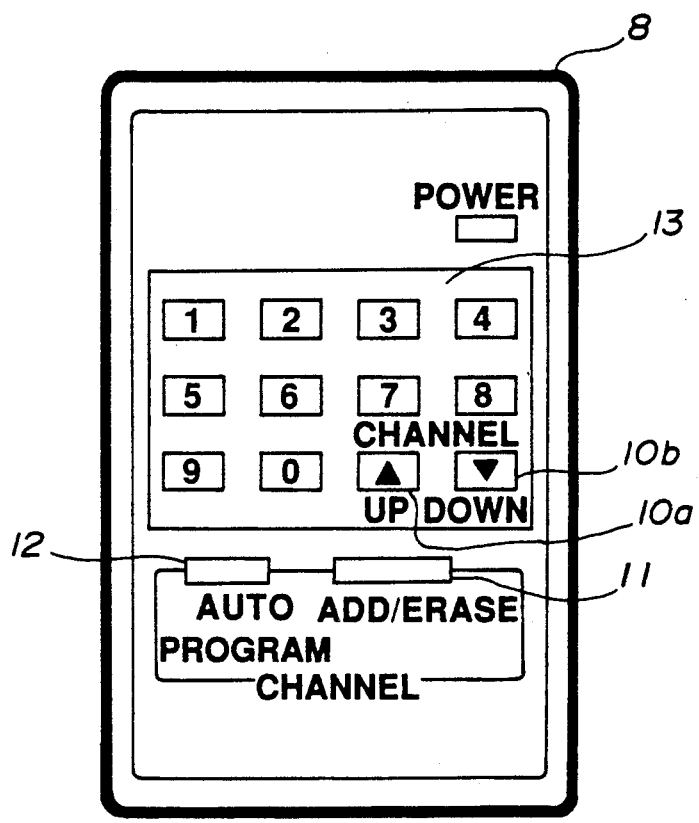
FIG. 2 is a plan view showing an operating surface of an input apparatus in FIG. 1.

FIG. 2 is a plan view showing an operating surface of this input apparatus 8.

The input apparatus 8 has a channel UP key 10a, DOWN key 10b, ADD/ERASE key 11, AUTO PROGRAM key 12 and ten-key keypad 13 and outputs control data based on the operation of these keys to the channel selecting microcomputer 3. The channel selecting microcomputer 3 has first means 41 and second means 42. These means 41 and 42 are controlled by control data from the input apparatus 8, output from terminal 34 to the tuner 2 a channel selection controlling signal based on this control data and determine a receiving frequency. Also, the second means 42 of the channel selecting microcomputer 3 judges by the judging signal received from the synchronizing circuit 7 whether or not the receiving channel is a signal channel. The channel selection controlling signal of the channel selecting microcomputer 3 is tuned by an AFT signal and the receiving frequency is automatically fine tuned.

The channel selecting microcomputer 3 has a volatile RAM for the data of the memory channels. The data of the memory channels are stored according to signals provided by the ADD/ERASE key 11 or AUTO PROGRAM key 12. That is to say, when the user designates a channel number by the ten-key 13 and then operates the ADD/ERASE key 11, the channel selecting microcomputer 3 will have a RAM 9 store data showing the channel number designated by the ten-key keypad 13. When the user designates the channel again by the ten-key keypad 13 and then opeates the ADD/ERASE key 11 again, the data stored in the RAM will be erased. If the AUTO PROGRAM key 12 is operated, first the channel selecting microcomputer 3 will output a channel selection controlling signal to the tuner 2 and sequentially select respective channels. In this case, the channel selecting microcomputer 3 will judge the respective receiving channels by the judging signal from the synchronizing circuit 7 as to whether they are signal channels or no-signal channels and will have the RAM 9 memorize the data showing the channel numbers of the signal channels.

Further, in this embodiment, when the channel UP key 10a or DOWN key 10b is operated, the first means 41 of the channel selecting microcomputer 3 will first search whether or not the data of a predetermined channel number is stored in the RAM 9. That is to say, the first means 41 of the channel selecting microcomputer 3 will investigate whether or not the same data as the data showing the channel to be searched (which shall be mentioned as a searched channel hereinafter is stored or not in the RAM 9 or not. In case the searched channel is a memory channel, the first means 41 will have this channel selected. Also, the channel selecting microcomputer 3 searches all the memory channels stored in the RAM 9 by varying the searched channel by the first means, searches the signal channel, and will instruct an up/down-channel selecting operation by the second means 42 in case no memory channel is stored in the RAM 9. Also, in the channel selecting apparatus of this embodiment, by providing a stand-by power source, even when the main power source is off, the data stored in the RAM 9 will remain for several hours.

Figure 3:
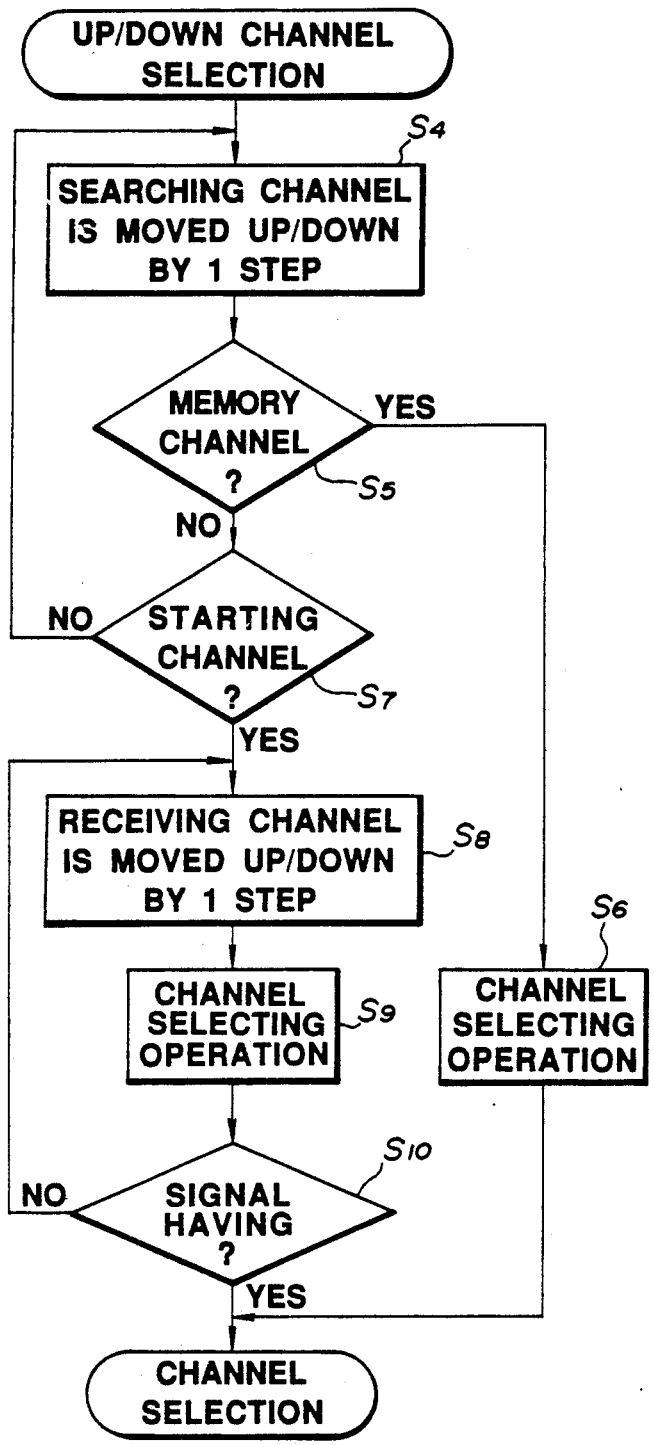
FIG. 3 is a flow chart for explaining the operation of an embodiment.
Figure 4:
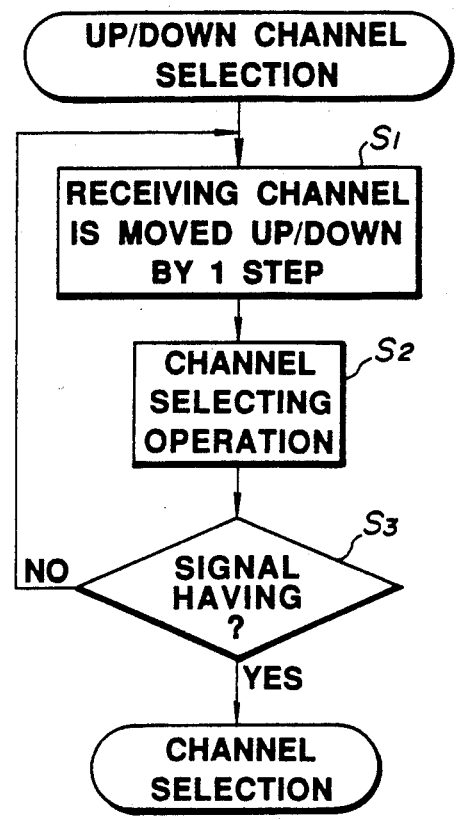
FIG. 4 is a flow chart for explaining the operation of a conventional channel selecting apparatus.

The operation of the channel selecting apparatus shall be explained as follows with reference to the flow chart in FIG. 3.

The steps S4 to S7 show an operation sequence in the case of searching memory channels and up/down-selecting channels by the first means 41, and the steps S8 to S10 show an operation sequence in the case of searching signal channels and up/down-selecting channels by the second means 42. When the user operates the UP key 10a or DOWN key 10b of the input apparatus 8, in the steps S4 and S5, the first means 41 will compare the data memorized in the RAM 9 and the data of the searched channel and search whether or not the data showing the same channel as the searched channel is stored in the RAM 9. At the time of starting the search, a searched channel up or down by one step from the currently received channel (starting channel) will be designated based on the operation of the UP key 10a or DOWN key 10b and, at the time of the next search, in the step S4, the searched channel will be renewed by one step. If the data showing the same channel as the searched channel is stored in the RAM 9, the process will move to the step S6 and the first means 41 will output to the tuner 2 a channel selection controlling signal based on this channel number. The tuner 2 converts to an IF signal the signal of this channel among the RF signals received by the antenna 1 and provides the IF signal to the video receiving circuit 4. Also, if the frequency of the IF signal from the tuner 2 is different, the channel selection controlling signal of the channel selecting microcomputer 3 will be tuned, and the receiving frequency of the tuner 2 will be tuned by the AFT signal output from the AFT circuit 6 to a frequency of a predetermined value. The video signal from the video receiving circuit 4 will be provided to the cathode-ray tube 5 and a television broadcast of the searched memory channel will be displayed.

On the other hand, if the data showing the channel next to the starting channel is not stored in the RAM 9, in the next step S7, it will be determined whether or not this channel is the starting channel and, if it is not the starting channel, the process will proceed to the step S4. Thereafter, in the step S4, the searched channel will vary by one step and, until the memory channel is found, the loop of the steps S4, S5 and S7 will be repeated. If the data of the memory channel is not stored in the RAM 9, the process will proceed from step S7 to step S8. Thus, by process of steps S4 to S7, a memory channel up/down-channel selection will be made. In case the memory channel is not memorized in the RAM 9, then a signal channel search and up/down-channel selection will be made by step S8 to S10.

That is to say, in the step S8, the second means 42 will output to the tuner 2 a channel selection controlling signal based on the channel number larger (or smaller) by 1 than the starting channel. In the step S9, the tuner 2 will select this channel. The synchronizing circuit 7 will output to the channel selecting microcomputer 3 a judging signal showing whether or not a horizontal synchronizing signal is included in the RF signal selected by the tuner 2. In the step S10, the second means 42 will judge by the judging signal whether or not the receiving channel is a signal channel. In case the receiving channel is not a signal channel, the process will be returned to the step S8 and the second means 42 will output a channel selection controlling signal for receiving the next channel. Thus, a signal channel search is made by the process of steps S8, S9 and S10. If the receiving channel is a signal channel, this channel will be received.

Thus, in this embodiment, in the steps S4 to S7, an up/down-channel selection of memory channels is made. If the data of the memory channel is not stored in the RAM 9, the process will proceed to the loop of the steps S8 to S10 and a signal channel search and up/-down-channel selection will be made. Therefore, regardless of whether or not the data of the memory channel is memorized in the RAM 9, when the user operates only the UP key 10a and DOWN key 10b, the channel will be easily selected. For example, even if both of the main power source and stand-by power source are off for a predetermined period, it will not be necessary in selecting channels to consider whether or not the data of the memory channel of the RAM 9 has been erased and the operability at the time of selecting channels will remarkably improve.

In the above mentioned embodiment, although the channel selecting apparatus of a television receiver is explained, the present invention can be used to select channels not only in the television receiver but also, for example, in a VTR (video tape recorder). The present invention is not limited to only the above mentioned embodiment but can be variously modified within the range not deviating from the subject matter of the invention.

What is claimed is:

1. A channel selecting apparatus in a television receiving apparatus, said channel selecting apparatus capable of memorizing data and comprising:

tuner means for selecting and receiving television signals from any of a plurality of channels, said channels respectively identified by channel selection controlling signals;

means for judging whether or not television signals are present in the channels selected by said tuner means and outputting a judging signal;

memory means for storing data indicative of received television signals of predetermined channels;

signal feeding means for providing said tuner means with channel selection controlling signals, said signal feeding means including:

first means for providing said tuner means with said channel selection controlling signals for sequentially selecting television signals of channels according to said data stored in said memory means; and second means for providing said tuner means with said channel selection controlling signals for sequentially selecting channels in which television signals are present by: first, determining if said data is stored in said memory means and second, if said data is not stored for any channel, determining if television signals are present by monitoring said judging signal.

2. A channel selecting method, pertaining to a television receiving apparatus having a memory for storing data indicating those channels on which television signals may be received, for selecting channels by providing a tuner with channel selection controlling signals for controlling said tuner, said method comprising the steps of:

generating data indicative of a channel being examined;

judging whether data is stored in said memory for said channel being examined, indicating that television signals may be received on said channel being examined;

instructing a channel selecting operation to select said channel being examined if said judging step indicates that said data is present for said channel being examined;

varying said channel being examined by one-channel intervals until returning to an original one of said channels being examined if said judging step indicates that said data is not present for said channel being examined;

after said varying step has caused said channel being examined to return to said original one, outputting a channel selection controlling signal for increasing or decreasing received channels by one-channel intervals;

determining whether a broadcast signal is included in a received channel;

instructing said channel selecting operation to select said received channel if said determining step indicates that a broadcast signal is included in said received channel; and repeating said outputting and determining steps if said determining step indicates that no broadcast signal is included in said received channel.

* * * * *